(12) United States Patent
Bassett et al.

(10) Patent No.: US 11,815,320 B2
(45) Date of Patent: Nov. 14, 2023

(54) GENERAL PURPOSE ENCLOSURE

(71) Applicant: Redline Communications Inc., Markham (CA)

(72) Inventors: Mark D. Bassett, Markham (CA); Brad Stimpson, Markham (CA)

(73) Assignee: Aviat U.S., Inc., Austin, TX (US)

( * ) Notice: Subject to any disclaimer, the term of this patent is extended or adjusted under 35 U.S.C. 154(b) by 0 days.

(21) Appl. No.: 18/052,332

(22) Filed: Nov. 3, 2022

(65) Prior Publication Data

US 2023/0086028 A1 Mar. 23, 2023

Related U.S. Application Data

(63) Continuation of application No. 16/946,644, filed on Jun. 30, 2020, now Pat. No. 11,519,677.

(51) Int. Cl.
*F28F 3/04* (2006.01)
*F25D 11/00* (2006.01)

(52) U.S. Cl.
CPC ............... *F28F 3/04* (2013.01); *F25D 11/00* (2013.01)

(58) Field of Classification Search
CPC ......... F28F 3/04; F28F 2265/12; F25D 11/00; H02B 1/26; H02B 1/28; H05K 5/06; H05K 5/061; H05K 5/062; H05K 5/063; H05K 5/064; H05K 5/065; H05K 5/066; H05K 5/067; H05K 5/068; H05K 5/069; F16K 17/00
USPC .......................................................... 165/53
See application file for complete search history.

(56) References Cited

U.S. PATENT DOCUMENTS

| 7,031,158 | B2 * | 4/2006 | Leon | H05K 7/20336 |
| | | | | 174/15.1 |
| 8,724,327 | B2 * | 5/2014 | Ma | H01L 23/4093 |
| | | | | 361/704 |
| 11,519,677 | B2 * | 12/2022 | Bassett | F28F 3/04 |

OTHER PUBLICATIONS

Muhammad, E. H. (2015). A comparison of the heat transfer performance of a hexagonal pin fin with other types of pin fin heat sinks. International Journal of Science and Research (IJSR) ISSN (Online), 2319-7064.
Nabati, H. (2008). Optimal pin fin heat exchanger surface (Doctoral dissertation, Mälardalen University).

* cited by examiner

*Primary Examiner* — Henry T Crenshaw
*Assistant Examiner* — Kamran Tavakoldavani
(74) *Attorney, Agent, or Firm* — Stratford Group Ltd.

(57) ABSTRACT

A general purpose enclosure is provided. A general purpose enclosure for housing an internal unit and providing complete protection against an ingress of dust and water, comprising a first housing and a second housing. A plurality of cooling fins and one or more pressure ports along an exterior surface of the first housing and the second housing. One or more pressure ports comprising a pneumatic valve, pressure sensor cap and a vent membrane such that pressure venting, and pressure testing may be performed by the one or more pressure ports. A method of assembling a general purpose enclosure to an internal unit, comprising applying the first housing and the second housing to the internal unit such that the first housing and the second housing encompass the internal unit and fastening the first housing to the second house.

20 Claims, 11 Drawing Sheets

GENERAL PURPOSE ENCLOSURE

CROSS REFERENCE TO RELATED APPLICATIONS

This application is a continuation of U.S. patent application Ser. No. 16/946,644, filed Jun. 30, 2020, now allowed, which is hereby incorporated by reference in its entirety.

FIELD OF INVENTION

The present disclosure relates to a general purpose enclosure, more specifically but not by way of limitation, a general purpose enclosure that provides the internal unit complete protection against the ingress of dust and airborne particles (IP6X) and protection against water and liquids (IPX7).

BACKGROUND

Typically, general purpose enclosures only allow for a single sided mounting, which reduces the flexibility of installation. Most general purpose water and dust resistant enclosures contain a high fastener count, which increases assembly time and cost. General purpose enclosures may include thin enclosure walls, which protrude the material needed for component clearance and thread bosses to the exterior surface which restrict airflow over the exterior surface. General purpose enclosures may employ cooling fins in suboptimal geometries and configurations for effective heat energy transfer.

Heat dissipation in electrical enclosures is imperative for the internal unit's ability to function effectively and over a long period of time. Employing cooling fins to the exterior of enclosures is common within the industry, but these often involve inefficient geometries and configures. The various pin fin heat sink geometries, such as round, elliptical, square, rectangular, drop-shaped and hexagonal, and configurations, such as continuous/in-line and staggered, have been modeled and experimentally analyzed under varying degrees of forced convection for minimizing thermal resistance [1][2]. Utilization of more efficient geometries and configures has yet to be applied.

Additionally, general purpose enclosures commonly undergo internal pressure fluctuations including the telecommunications equipment encased within, which inflicts significant stress on the housing seals. The internal pressure fluctuations are typically caused by sudden environmental and temperature changes in the field in which the equipment is deployed. During employment in the field, this stress may result in compromising the seals and the internal equipment's reliability. Compromised seals may then allow the entry of contaminants such as dirt, dust, and rain into the enclosure, resulting in premature failure of the electronics.

There is a need for a general purpose enclosure which provides the internal unit complete protection against the ingress of dust and airborne particles and protection against water and liquids to an IP67 rating for performance and longevity, provides a structural cooling system to maximize wattage dissipation from the cooling fins, is assembled from a reduced fastener count for cheaper and faster assembly, and provides access for field testing, maintenance and installation.

REFERENCES

[1] Muhammad, E. H. (2015). A comparison of the heat transfer performance of a hexagonal pin fin with other types of pin fin heat sinks. *International Journal of Science and Research (IJSR) ISSN (Online)*, 2319-7064.

[2] Nabati, H. (2008). *Optimal pin fin heat exchanger surface* (Doctoral dissertation, Mälardalen University).

BRIEF SUMMARY

It is the object of the present invention to provide a general purpose enclosure. A general purpose enclosure for housing an internal unit and providing complete protection against an ingress of dust and water, comprising a first housing and a second housing. A plurality of cooling fins and one or more pressure ports along an exterior surface of the first housing and the second housing. One or more pressure ports comprising a pneumatic valve, pressure sensor cap and a vent membrane such that pressure venting, and pressure testing may be performed by the one or more pressure ports.

In accordance with an aspect of the invention, there is provided a method of assembling a general purpose enclosure to an internal unit, comprising applying the first housing and the second housing to the internal unit such that the first housing and the second housing encompass the internal unit and fastening the first housing to the second house.

In accordance with an aspect of the invention, there is provided a method of assembling a general purpose enclosure to an internal unit, comprising applying the first housing and the second housing to the internal unit such that the first housing sealing gland rib couples to the second housing sealing gland groove and the first housing and the second housing encompass the internal unit and fastening the first housing to the second house.

In accordance with an embodiment of the invention, the cooling fins are straight and cross-cut.

In accordance with an embodiment of the invention, the first housing and the second housing are symmetrical.

In accordance with an embodiment of the invention, the pneumatic valve is a Schrader valve.

In accordance with an embodiment of the invention, the first housing is fastened to the second house by one or more fastener bosses and fasteners.

In accordance with an embodiment of the invention, the one or more fastener bosses are reversible such that one or more mounting fasteners may be applied to the first housing or the second housing.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The details of one or more embodiments of the subject matter of this specification are set forth in the accompanying drawings and the description below. Other features, aspects, and advantages of the subject matter will become apparent from the description, the drawings, and the claims.

Like reference numbers and designations in the various drawings indicate like elements.

Figure 1:
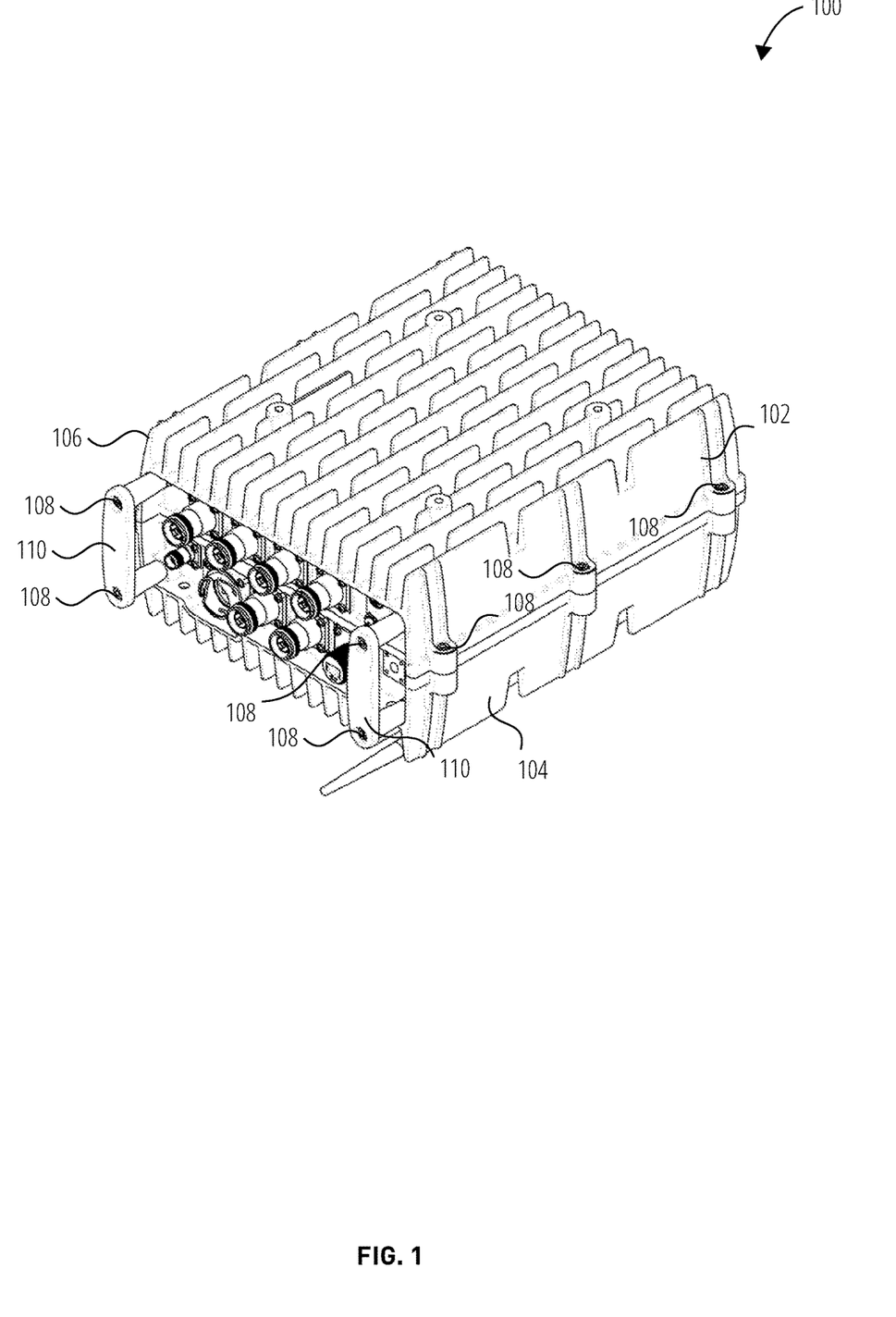
FIG. 1 illustrates a perspective view 100 in accordance with one embodiment.

FIG. 1 depicts a perspective view 100 of a general purpose enclosure encompassing a transceiver as in one embodiment. A general purpose enclosure houses an internal unit and provides complete protection against an ingress of dust and water. The general purpose enclosure comprises a first housing and a second housing, such as the top housing 102 and the bottom housing 104 in this embodiment, with a plurality of cooling fins 106 and one or more pressure ports along an exterior surface of the first housing and the second housing. A method of assembling a general purpose enclosure to an internal unit comprises applying the first housing and the second housing to the internal unit such that the first housing and the second housing encompass the internal unit and the first housing is fastened to second house. In some embodiments, the first housing is fastened to the second house by one or more bosses and fasteners 108.

In the embodiment shown, a bottom housing 104 and a top housing 102 of an enclosure are shown secured to an existing transceiver. The bottom housing 104 and the top housing 102 are displayed as symmetrical halves that are identical in perimeter geometry, which allows for flexibility when mounting the transceiver as either side is capable for mounting. As well, the bosses for fasteners 108 may be designed to be reversible and the top housing 102 and the bottom housing 104 can be selectively made with mounting fasteners that are applied from the top or bottom direction. This symmetry includes the radius on the sidewalls, cooling fin configuration, and bosses. The bottom housing 104 and the top housing 102 shown may be composed of an aluminum die casting.

Both the top housing 102 floor and the bottom housing 104 floor are not contoured to a specific transceiver printed circuit board (PCB) configuration. The floors are a thick slab and are secondary machined to accommodate a particular product stock keeping unit (SKU). The thickness provides extreme rigidity such that the housing won't flex, it provides flexibility to be machined to any electrical configuration, bosses and thermal risers while providing aerodynamics desirable for heat transfer.

The top housing 102 is male with a sealing gland and the bottom housing 104 is female with a sealing gland. The rear of bottom housing 104 includes bosses for the attachment of a removable carrying handle 110. The bottom housing 104 includes one or more bosses that performs two separate functions, pressure venting and pressure filling. The top housing 102 and the bottom housing 104 have thick wall sections, in order to apply a high axial load without deflection to the bottom housing 104 sealing gasket, typically with a minimal number six of fastener bosses.

There is an assembly of parts for pressure venting and pressure testing. A vent membrane allows pressure equalization of the internal gas during temperature fluctuations. The vent membrane prevents water entry at atmospheric pressure. The boss allows for the attachment of a fitting for pneumatic pressure testing, confirming the water ingress integrity. This assembly may be comprised of a boss which is national pipe tapered (NPT) threaded for the field attachment of a pneumatic valve, a boss which includes a counter bore for the acceptance of a production fitting for the pressure test, a boss which includes a counter bore for the placement of the pressure vent membrane, a boss which includes a counter bore for the placement of a square cut backing gasket and a boss which includes a counter bore for the placement of a proprietary designed gasket retainer. Reflective decals may be attached to the sidewalls of the bottom housing 104 for product installation identification under poor lighting conditions.

Figure 2:
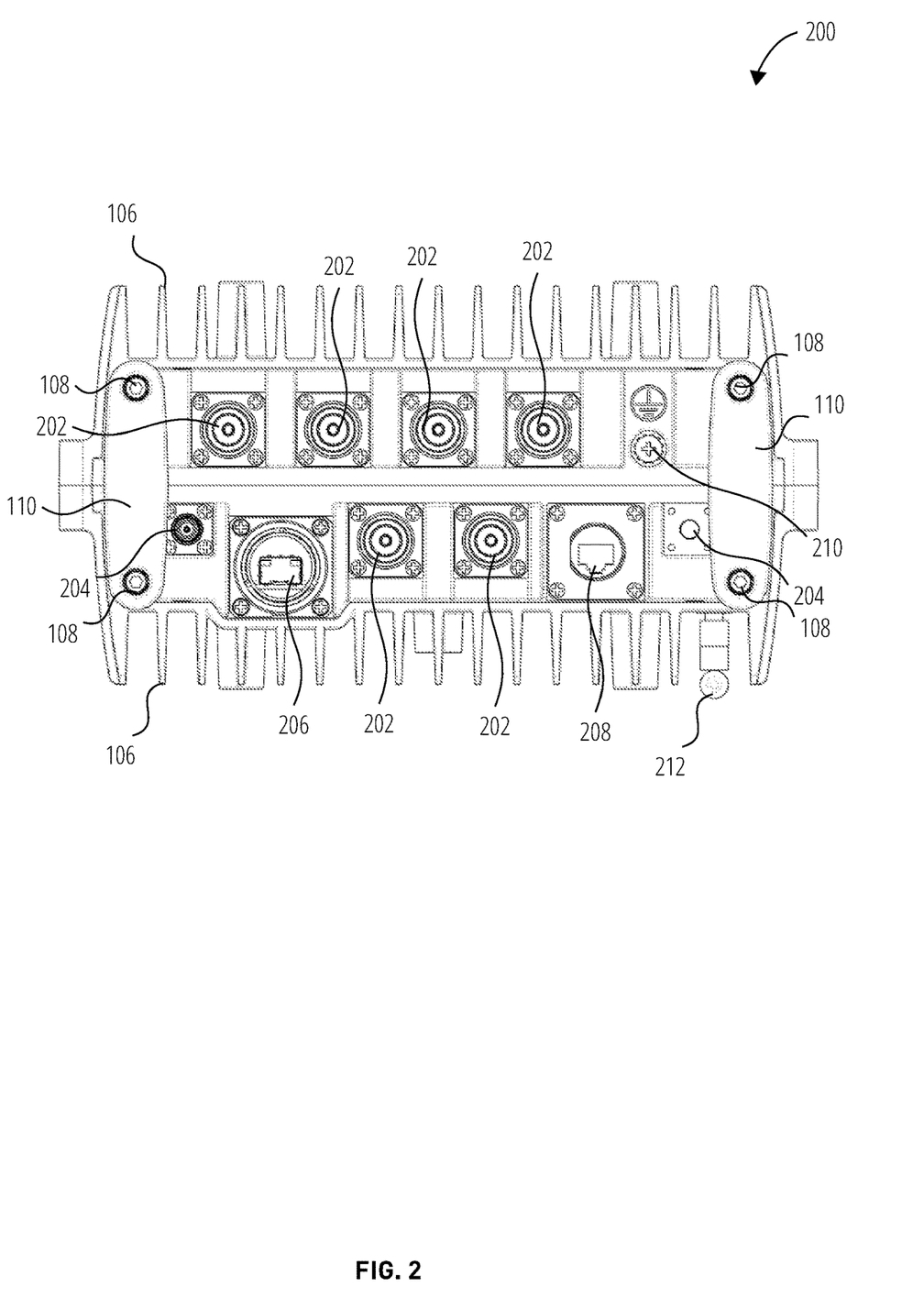
FIG. 2 illustrates a face view 200 in accordance with one embodiment.

FIG. 2 depicts a face view 200 of the general purpose enclosure encompassing a transceiver as in one embodiment. The face of the assembled unit is vertical and includes both through holes and knock-outs for input and output connectors. Examples for various input and output connectors may include, but are not limited to, 4.3-10 radio frequency (RF) connectors represented by the input/output connectors 202, Threaded Neill-Concelman (TNC) connectors represented by the TNC RF connector 204, small form-factor pluggable (SFP) connectors represented the SFP transceiver 206, and RJ45 power over ethernet (POE) connectors represented by the POE connector 208. Additionally, these various input and output connectors may contain an o-ring for preventing water ingress and a ground screw 210 as shown.

The face and rear surfaces of assembled unit may include mounting bosses for the attachment of removable carry handles 214. The face of the assembled unit is shown including two removable carry handles 214 attachment to the top housing 102 and bottom housing 104 for transport and guard for the various connectors. The bottom housing 104 may be fitted with an aluminum flat cover or plastic antenna radome 212 for integrated antennas and may also contain, but is not limited to, Bluetooth or GPS antennas.

The cooling fins 106 shown are projections from the top housing 102 and the bottom housing 104 that increase the surface area from which heat can be radiated away from a device. Since the cooling fins 106 project outwards, the area for emitting heat back into an electronic circuit's container smaller than the area emitting heat to the outside environment, resulting in efficient heat energy transfer outside of the device's housing. The cooling fins 106 have a very large surface area to let heat out to the surroundings as quickly as possible.

Figure 3:
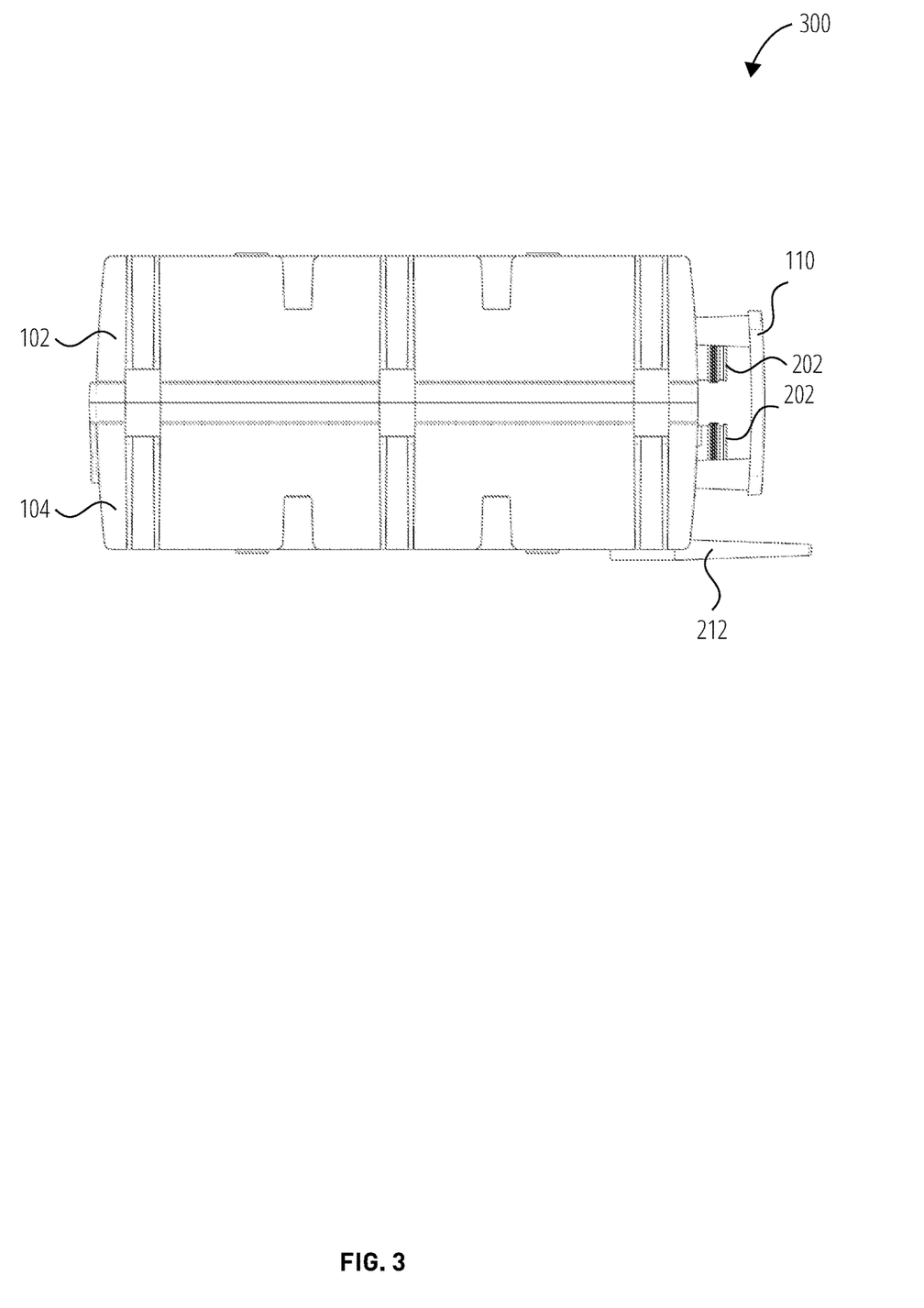
FIG. 3 illustrates a side view 300 in accordance with one embodiment.

FIG. 3 depicts side view 300 of the general purpose enclosure encompassing a transceiver as in one embodiment. The top housing 102 and the bottom housing 104 are shown secured to an existing transceiver with a carrying handle 110, an antenna radome 212 and a couple input/output connectors 202.

Figure 4:
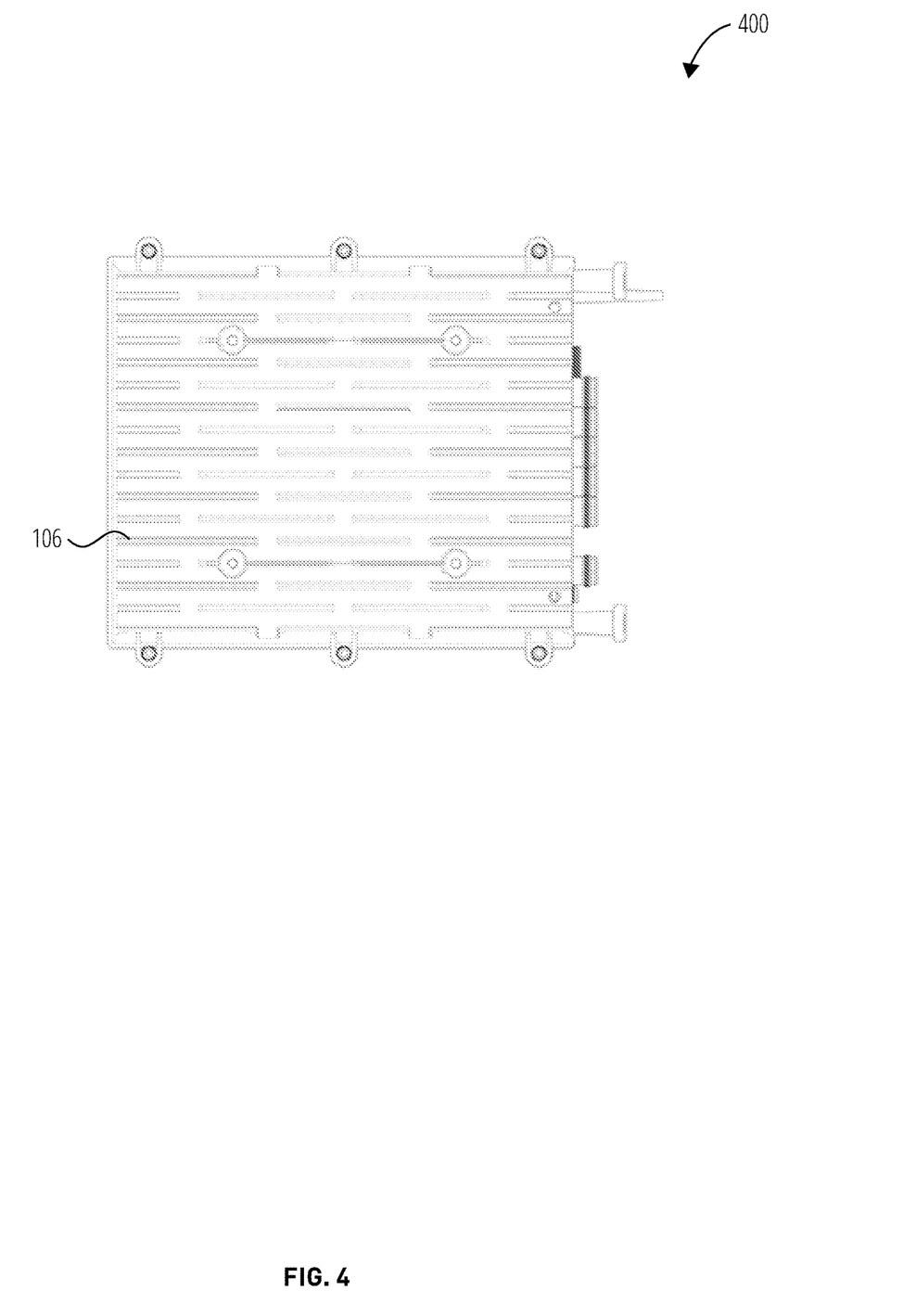
FIG. 4 illustrates a top view 400 in accordance with one embodiment.

FIG. 4 depicts top view 400 of the general purpose enclosure encompassing a transceiver as in one embodiment. This embodiment displays a configuration of a plurality of cross-cut, straight staggered cooling fins 106 which acts as a structural cooling system to maximize wattage dissipation for the transceiver and enclosure unit.

Figure 5:
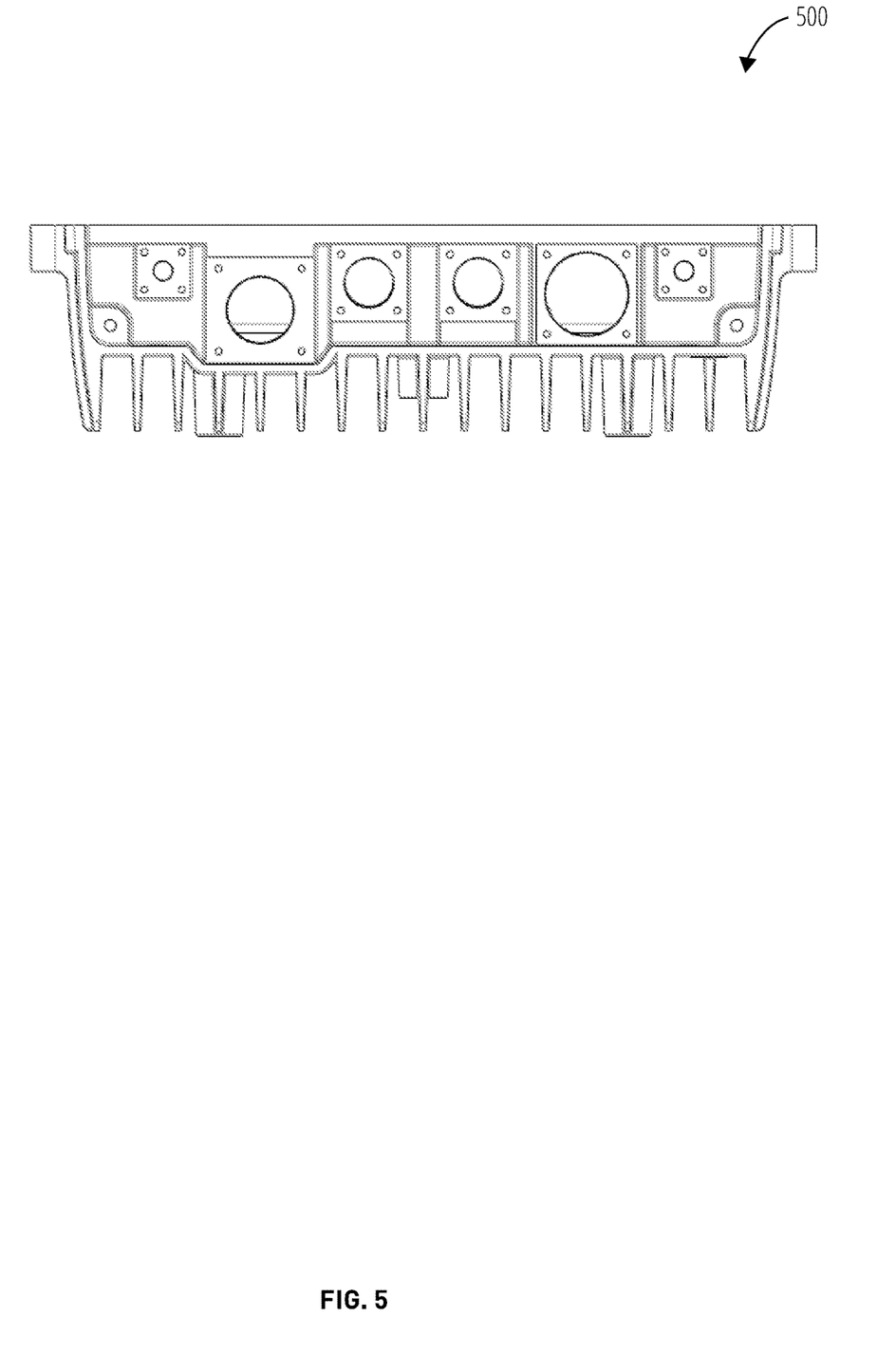
FIG. 5 illustrates a front view 500 in accordance with one embodiment.

FIG. 5 depicts a front view 500 of a bottom housing 104 of the general purpose enclosure as in one embodiment.

Figure 6:
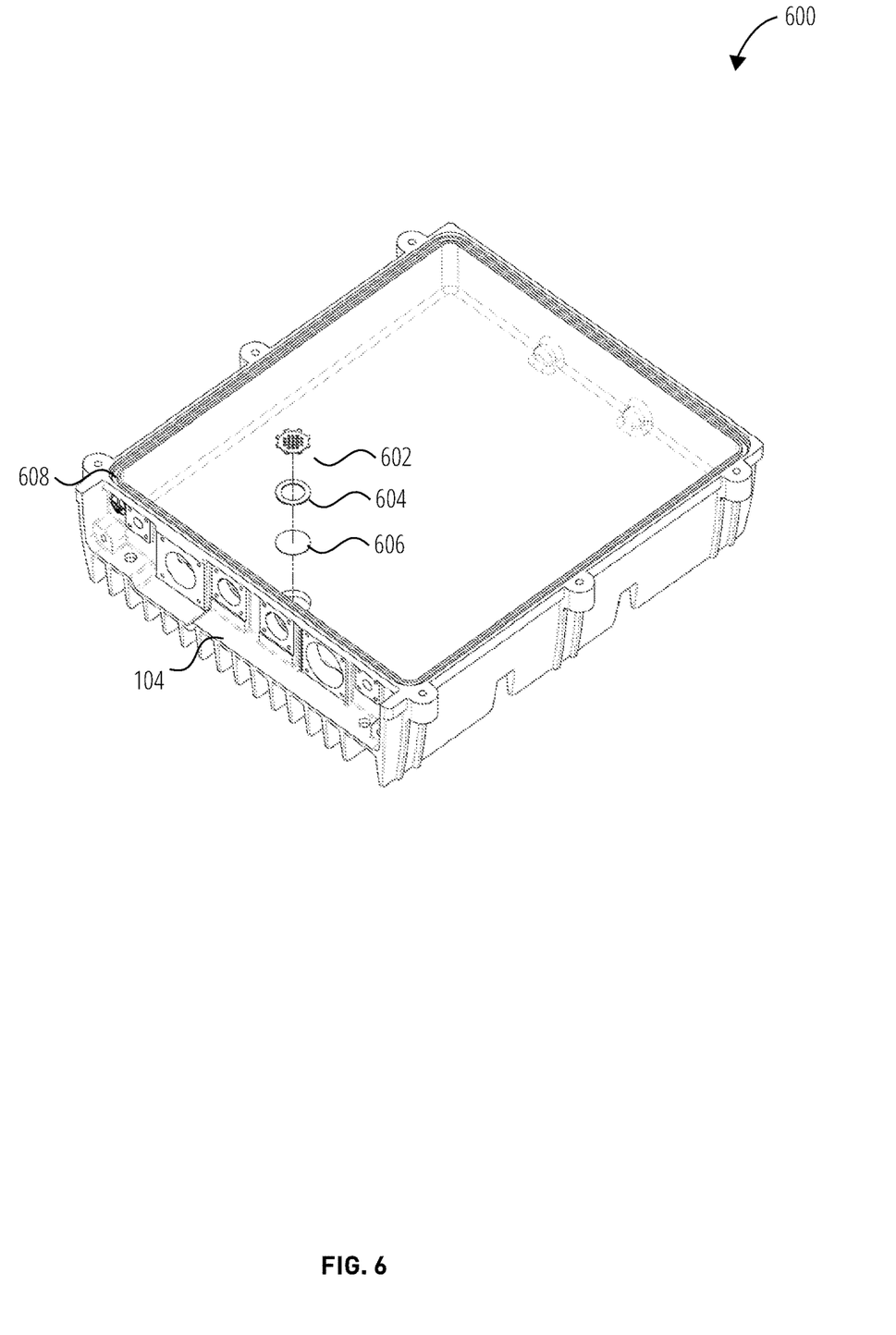
FIG. 6 illustrates an exploded view 600 in accordance with one embodiment.

FIG. 6 depicts an exploded view 600 of an inverted bottom housing 104 of the general purpose enclosure as in one embodiment. This example details the assembly of a pressure port boss geometry of the enclosure, which consists of joining an external retention washer 602, a flat neoprene washer 604 and a pressure vent membrane 606. This embodiment also displays the female sealing gland groove 608 along the inner perimeter of the bottom housing 104. The top housing 102 would contain a sealing gland rib may be coupled to a sealing gland groove 608 of bottom housing 104 housing. The external retention washer 602 serves two functions; it creates an axial load on the flat neoprene washer 604 and pressure vent membrane 606, in case the membrane adhesive dries out and prevents an object from penetrating the fiber membrane. The flat neoprene washer 604 is a synthetic rubber washer and the pressure vent membrane 606 is a protective vent membrane.

The pressure vent membrane 606 allows air to move freely in and out of the enclosure for pressure equalization during temperature and humidity fluctuations and exposure to a full range of harsh environmental conditions such as hail, sand, snow, ice and rainstorms, while preventing the entry of moisture under normal atmospheric pressure. The use of pressure vent membranes 706 also eliminates stress and damage by corrosion or condensation on seals contributes in achieving the Ingress Protection level of IP67.

In some embodiments, a method of assembling a general purpose enclosure to an internal unit comprises applying the first housing and the second housing to the internal unit such that the first housing sealing gland rib couples to the second housing sealing gland groove 608 and the first housing and the second housing encompass the internal unit and the first housing is fastened to the second house.

Figure 7:
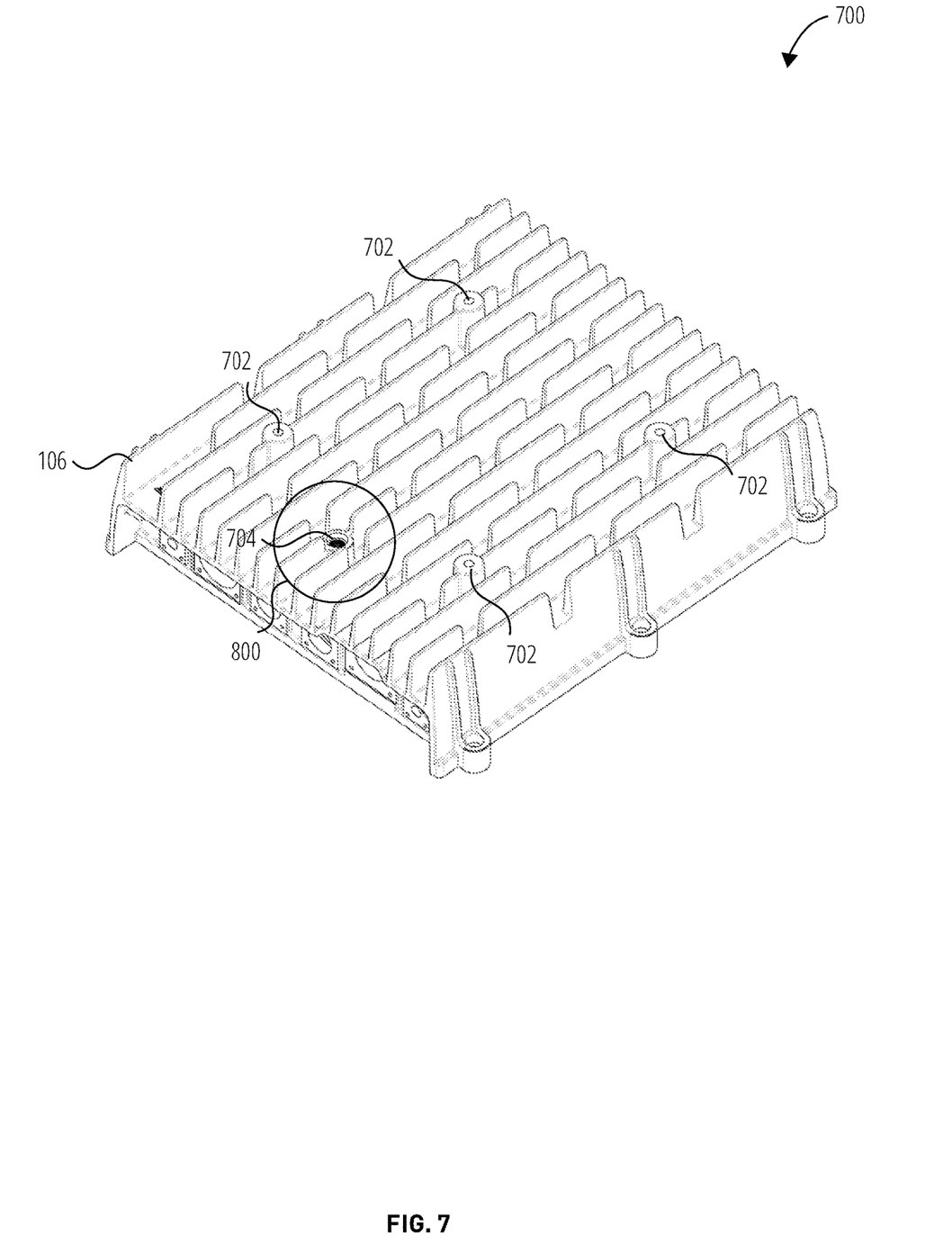
FIG. 7 illustrates an exterior surface view 700 in accordance with one embodiment.

FIG. 7 depicts an exterior surface view 700 of a bottom housing 104 of the general purpose enclosure as in one embodiment. This embodiment displays a cross-cut configuration of the cooling fins 106, several assembled pressure ports 702 and an unassembled pressure port 704. The assembled pressure ports 702 comprise a pneumatic valve, pressure sensor cap and a pressure vent membrane 606 such that pressure venting, and pressure testing may be performed by the pressure ports.

Figure 8:
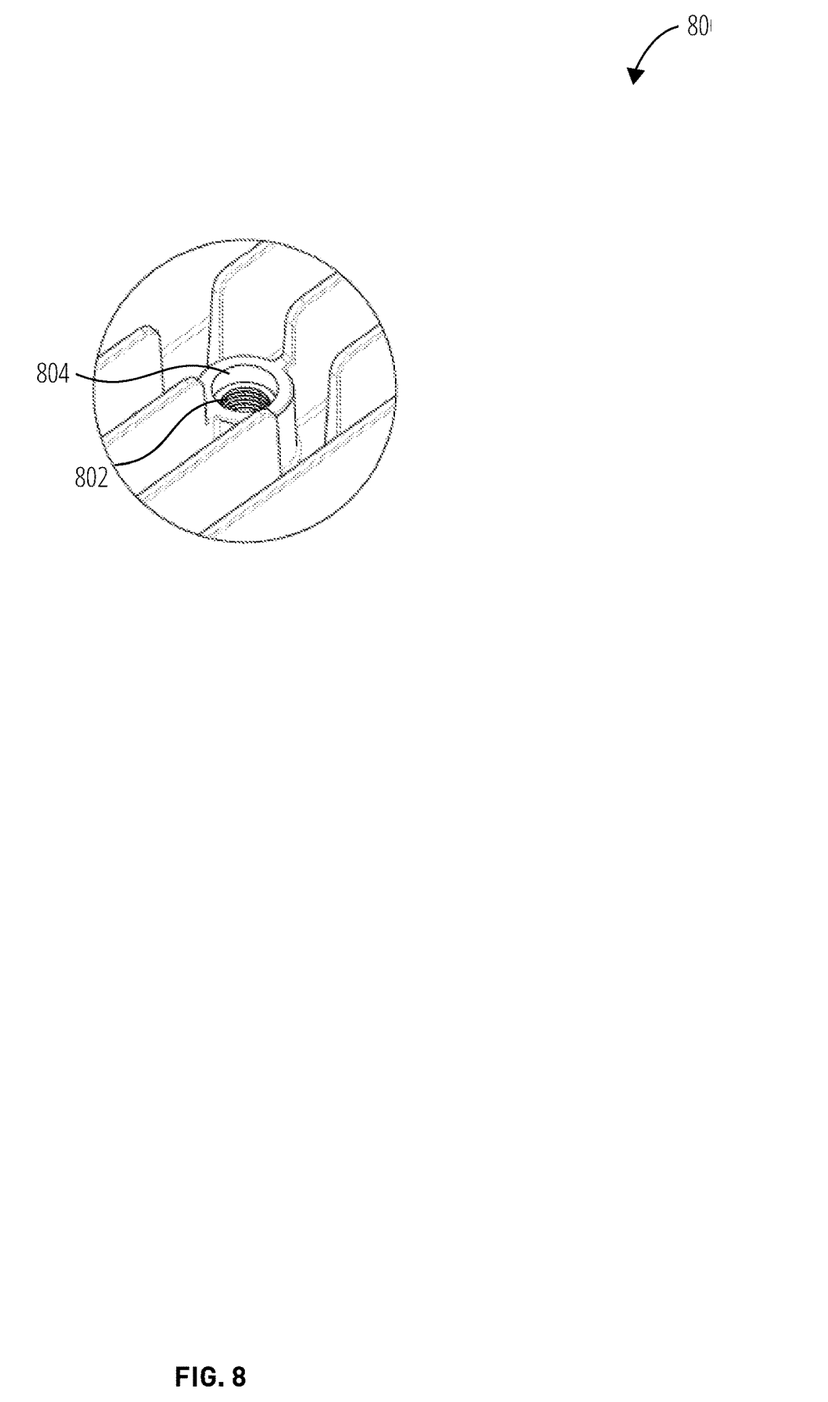
FIG. 8 illustrates a detailed view 800 in accordance with one embodiment.

FIG. 8 depicts a detailed view 800 of an unassembled pressure port 704 from a bottom housing 104 of the general purpose enclosure as in one embodiment. A fastener boss 802 is shown which may accept fasteners into the counterbore 804 for an assembled pressure port 702.

Figure 9:
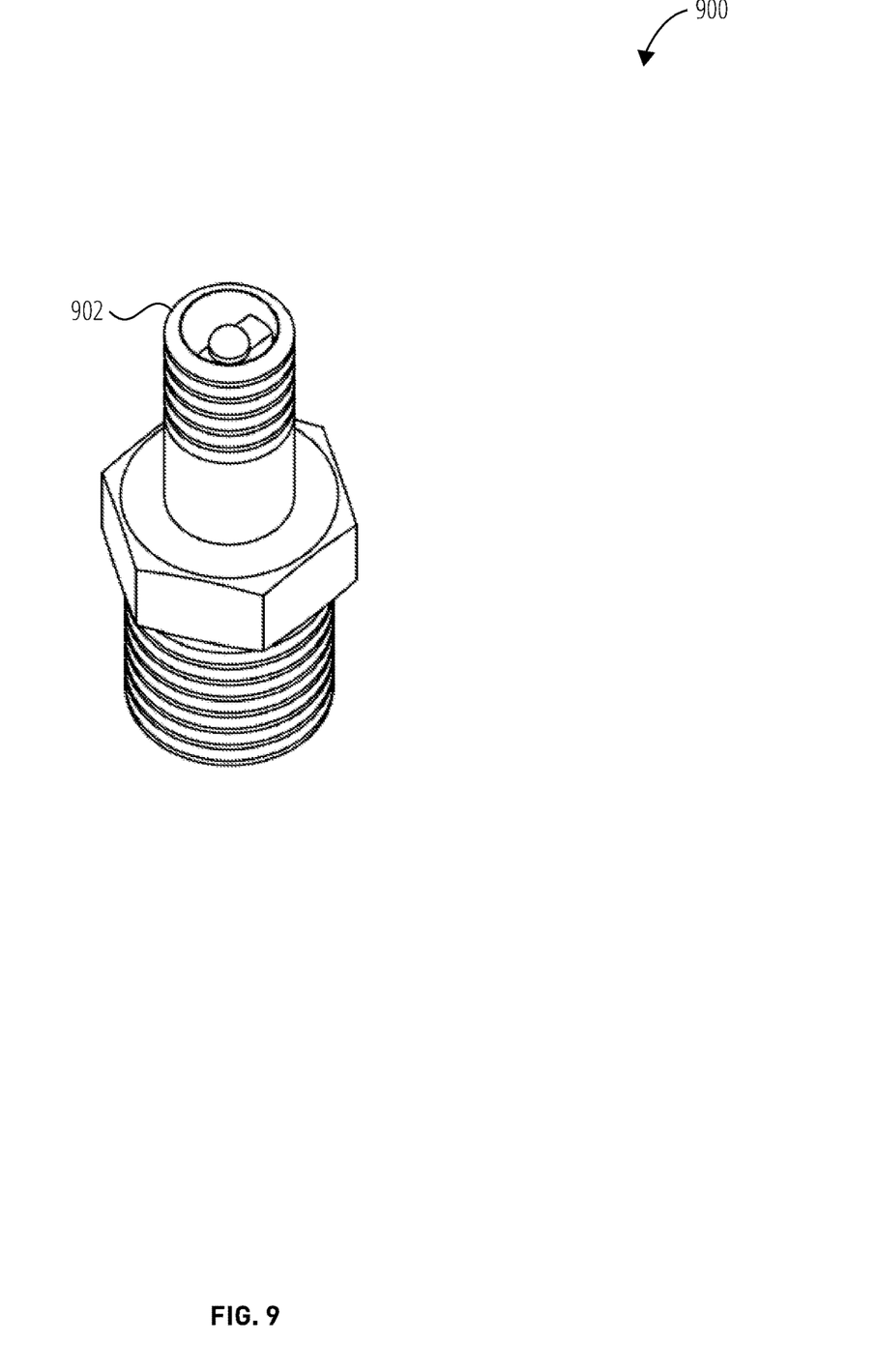
FIG. 9 illustrates a perspective view 900 in accordance with one embodiment.

FIG. 9 depicts a perspective view 900 of a pneumatic valve used in the assembly of an unassembled pressure port 704 of the general purpose enclosure as in one embodiment. The pneumatic valve shown in this embodiment is a Schrader valve 902, which may be threaded into the fastener boss 802. The Schrader valve 902 allows for the internal unit within the enclosure to be pressurized with a standard air pump, facilitating effortless installation and maintenance in the field.

Figure 10:
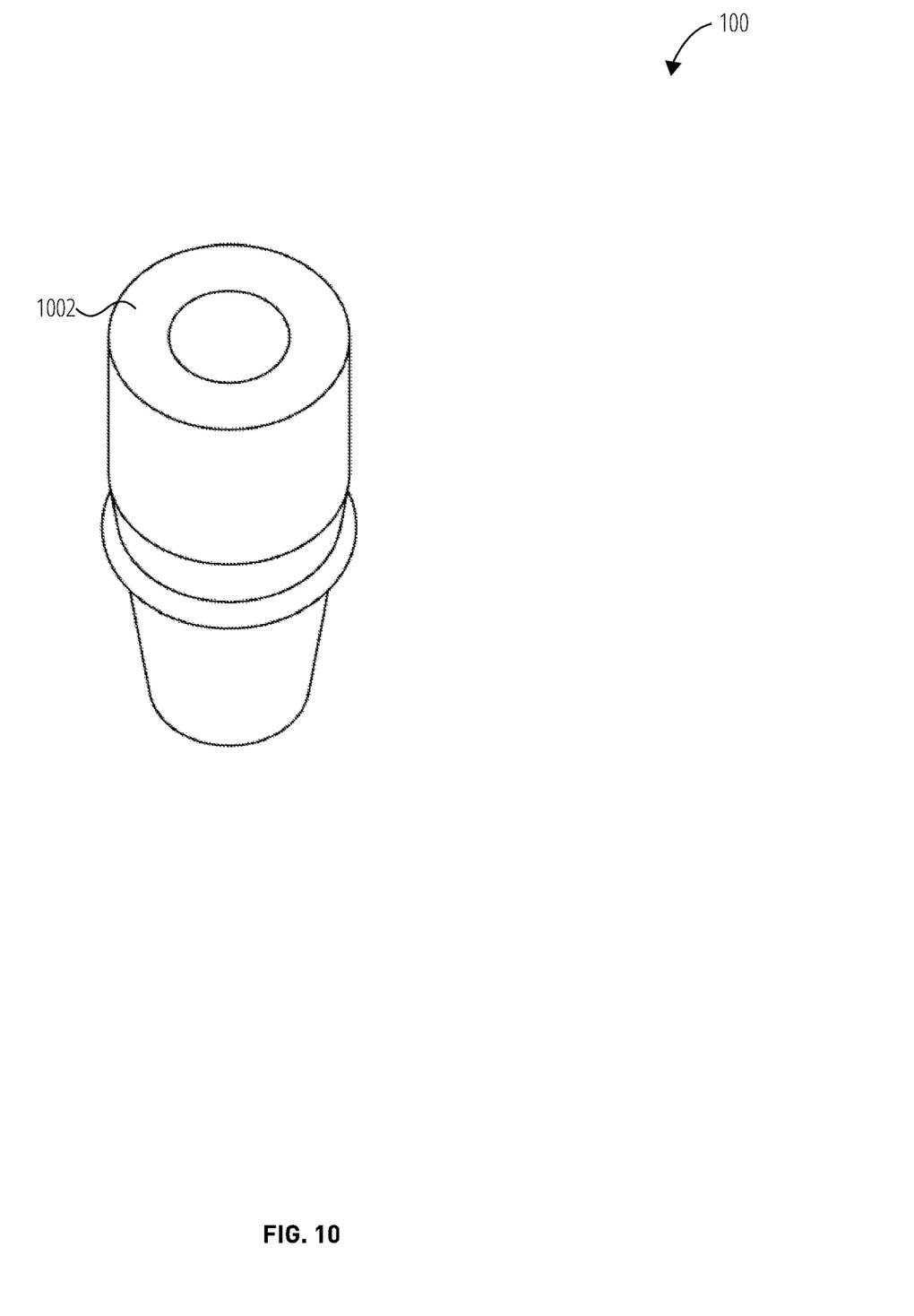
FIG. 10 illustrates a perspective view 1000 in accordance with one embodiment.

FIG. 10 depicts a perspective view 1000 of a pressure sensor cap 1002 used in assembly of an unassembled pressure port 704 of the general purpose enclosure as in one embodiment. The pressure sensor cap 1002 is part of the factory pressure test jig, where the test jig facilitates the probe of defined test points to help determine the expected inputs and outputs. In some embodiments, the pressure port fitting may contain an o-ring. The pressure sensor cap 1002 is attached to the pneumatic valve, such as a Schrader valve 902 in FIG. 9, and facilitates straightforward pressure testing and maintenance in the field for the internal unit within the enclosure.

Figure 11:
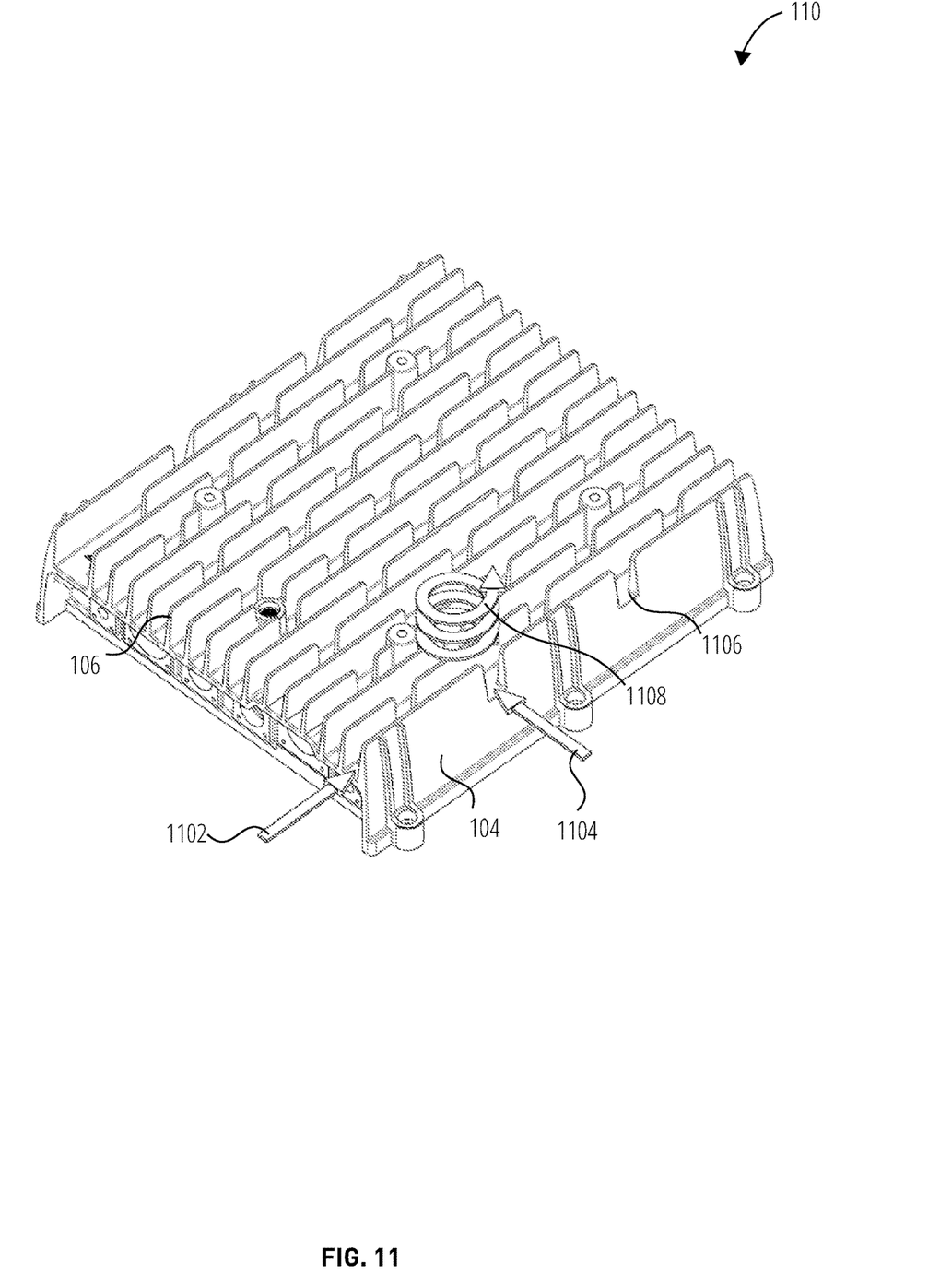
FIG. 11 illustrates an airflow diagram 1100 in accordance with one embodiment.

FIG. 11 depicts an airflow diagram 1100 of a bottom housing 104 of the general purpose enclosure as in one embodiment. Both of the top housing 102 and the bottom housing 104 consist of a plurality of cross-cut, straight staggered cooling fins 106. This configuration enables linear flow 1102 of air through the cooling fins 106, which is met by side flow 1104 from the side cross-cuts 1106. This interaction introduces eddy currents 1108, which accelerates the air flow to the exterior resulting in improved thermal convection for the enclosure. Furthermore, since component clearances and bosses for fasteners are internal, the airflow over the exterior surface and cooling fins 106 is not compromised.

The foregoing descriptions of specific embodiments of the present invention have been presented for purposes of illustration and description. They are not intended to be exhaustive or to limit the invention and method of use to the precise forms disclosed. Obviously, many modifications and variations are possible in light of the above teaching. The embodiments described were chosen and described in order to best explain the principles of the invention and its practical application, and to thereby enable others skilled in the art to best utilize the invention and various embodiments with various modifications as are suited to the particular use contemplated. It is understood that various omissions or substitutions of equivalents are contemplated as circumstance may suggest or render expedient but is intended to cover the application or implementation without departing from the spirit or scope of the claims of the present invention.

What is claimed is:

1. A general purpose enclosure for housing an internal unit, comprising:
   a first housing; and
   a second housing,
   at least one of the first housing and the second housing including one or more cooling fins and at least one of the first housing and the second housing including one or more pressure ports along an exterior surface thereof.

2. The general purpose enclosure of claim 1, wherein said cooling fins are straight and cross-cut.

3. The general purpose enclosure of claim 1, wherein said first housing and said second housing are symmetrical.

4. The general purpose enclosure of claim 1, wherein said first housing includes a sealing gland rib that may be coupled to a sealing gland groove of said second housing.

5. The general purpose enclosure of claim 1, wherein each of the one or more pressure ports comprises a pneumatic valve.

6. The general purpose enclosure of claim 5, wherein said pneumatic valve is a Schrader valve.

7. The general purpose enclosure of claim 1, wherein each of the one or more pressure ports comprises a vent membrane.

8. The general purpose enclosure of claim 1, wherein each of the one or more pressure ports comprises a pressure sensor cap.

9. The general purpose enclosure of claim 1, wherein each of the one or more pressure ports comprises a pneumatic valve, pressure sensor cap, and a vent membrane such that pressure venting and pressure testing may be performed with said one or more pressure ports.

10. The general purpose enclosure of claim 1, wherein said first housing and second housing are configured for sealing against one another to provide protection against ingress of particulate matter and liquids.

11. An apparatus comprising:

an internal unit;

a general purpose enclosure housing the internal unit and including:

a first housing; and a second housing, at least one of the first housing and the second housing including one or more cooling fins and at least one of the first housing and the second housing including one or more pressure ports along an exterior surface thereof.

12. The apparatus of claim 11, wherein the first housing is fastened to the second housing.

13. The apparatus of claim 12, wherein the first housing is fastened to the second housing by one or more fastener bosses and fasteners.

14. The apparatus of claim 13, wherein said one or more fastener bosses are reversible such that one or more mounting fasteners may be applied to said first housing or said second housing.

15. The apparatus of claim 11, wherein said first housing includes a sealing gland rib that is coupled to a sealing gland groove of said second housing.

16. The apparatus of claim 11, wherein each of the one or more pressure ports comprises a pneumatic valve.

17. The apparatus of claim 11, wherein each of the one or more pressure ports comprises a vent membrane.

18. The apparatus of claim 11, wherein each of the one or more pressure ports comprises a pressure sensor cap.

19. The apparatus of claim 11, wherein each of the one or more pressure ports comprises a pneumatic valve, pressure sensor cap, and a vent membrane such that pressure venting and pressure testing may be performed by said one or more pressure ports.

20. The apparatus of claim 11, wherein said first housing and second housing are configured for sealing against one another to provide protection against ingress of particulate matter and liquids.

* * * * *